US012785699B2

(12) United States Patent
Deng et al.

(10) Patent No.: US 12,785,699 B2
(45) Date of Patent: Nov. 3, 2026

(54) PHASE-LOCKED LOOP, SIGNAL PROCESSING DEVICE AND SIGNAL PROCESSING METHOD

(71) Applicant: Tsinghua University, Beijing (CN)

(72) Inventors: Wei Deng, Beijing (CN); Hongzhuo Liu, Beijing (CN); Haikun Jia, Beijing (CN); Baoyong Chi, Beijing (CN)

(73) Assignee: Tsinghua University, Beijing (CN)

( * ) Notice: Subject to any disclaimer, the term of this patent is extended or adjusted under 35 U.S.C. 154(b) by 6 days.

(21) Appl. No.: 18/872,004

(22) PCT Filed: Sep. 30, 2022

(86) PCT No.: PCT/CN2022/123554
§ 371 (c)(1),
(2) Date: Dec. 5, 2024

(87) PCT Pub. No.: WO2023/236398
PCT Pub. Date: Dec. 14, 2023

(65) Prior Publication Data
US 2025/0357934 A1 Nov. 20, 2025

(30) Foreign Application Priority Data
Jun. 6, 2022 (CN) ........................ 202210634606.5

(51) Int. Cl.
*H03L 7/08* (2006.01)
*H03L 7/087* (2006.01)
(Continued)

(52) U.S. Cl.
CPC .............. *H03L 7/087* (2013.01); *H03L 7/093* (2013.01); *H03L 7/0992* (2013.01)

(58) Field of Classification Search
CPC ....... H03L 7/0802; H03L 7/085; H03L 7/087; H03L 7/093; H03L 7/0992; Y02D 30/70
See application file for complete search history.

(56) References Cited

U.S. PATENT DOCUMENTS 6,816,018 B1 * 11/2004 Trumbo .................. H03L 7/087 375/375
10,979,059 B1 4/2021 Shalmani et al.
(Continued)

FOREIGN PATENT DOCUMENTS

CN 202949409 U 5/2013
CN 203313155 U 11/2013
(Continued)

OTHER PUBLICATIONS

First Office Action issued Jan. 11, 2025 by the China National Intellectual Property Administration for CN2022106346065.
(Continued)

*Primary Examiner* — Dac V Ha
(74) *Attorney, Agent, or Firm* — Thomas | Horstemeyer, LLP

(57) ABSTRACT

A phase-locked loop, a signal processing device and a signal processing method. In the phase-locked loop, a reference clock unit outputs two or more frequency-adjustable synchronous reference clock signals to a phase discrimination unit; a feedback unit performs frequency division processing on an output voltage signal, which is output by the phase-locked loop within a first period, so as to obtain a feedback signal; the phase discrimination unit determines a corresponding error signal for each reference clock signal according to the phase difference between each reference clock signal and the feedback signal; a weighting unit performs weighting calculation on the determined error signals, so as to obtain a weighted error signal; and a correction unit is configured to correct, according to the weighted error signal, an output voltage signal, which is output by the phase-locked loop within a second period.

14 Claims, 4 Drawing Sheets

(51) Int. Cl.

*H03L 7/093* (2006.01)
*H03L 7/099* (2006.01)

(56) References Cited

U.S. PATENT DOCUMENTS

| | | | | | |
|---|---|---|---|---|---|
| 11,038,511 | B2 * | 6/2021 | Weeks | H03L 7/0805 |
| 2009/0015338 | A1 | 1/2009 | Frey | |
| 2012/0206177 | A1 * | 8/2012 | Colinet | H03L 7/087<br>327/156 |
| 2021/0111725 | A1 * | 4/2021 | Bae | H03L 7/099 |
| 2024/0275392 | A1 * | 8/2024 | Sjöland | H03L 7/093 |

FOREIGN PATENT DOCUMENTS

| | | | |
|---|---|---|---|
| CN | 103959653 | A | 7/2014 |
| CN | 111277262 | A | 6/2020 |
| CN | 111837339 | A | 10/2020 |
| CN | 111953345 | A | 11/2020 |
| CN | 115037294 | A | 9/2022 |
| EP | 2315405 | A1 | 4/2011 |

OTHER PUBLICATIONS

International Search Report based on PCT/CN2022/123554 mailed Jan. 18, 2023.

* cited by examiner

PHASE-LOCKED LOOP, SIGNAL PROCESSING DEVICE AND SIGNAL PROCESSING METHOD

CROSS-REFERENCE TO RELATED APPLICATIONS

The present application is a U.S. National Phase Entry of International Application No. PCT/CN2022/123554 having an international filing date of Sep. 30, 2022, which claims the priority to the Chinese Patent Application No. CN202210634606.5, filed to the National Intellectual Property Administration, PRC on Jun. 6, 2022 and entitled "Phase-locked Loop, Signal Processing Device and Signal Processing Method", contents of the above-identified applications should be understood as being incorporated into the present application by reference.

TECHNICAL FIELD

Embodiments of the present disclosure relate to, but are not limited to, integrated circuit technologies, and particularly relate to a phase-locked loop, a signal processing device, and a signal processing method.

BACKGROUND

In recent years, continuous improvement of wireless communication technologies have put forward higher and higher requirements for phase noises of frequency sources used. A lower phase noise often requires higher power consumption. In a design process of a phase-locked loop, a design of a phase noise and power consumption has become an increasingly important issue.

The phase noise of the phase-locked loop may be roughly divided into two parts: in-band and out-of-band; wherein the out-of-band phase noise is mainly determined by a Voltage Controlled Oscillator (VCO), and the in-band phase noise is mainly determined by a reference clock; in order to minimize the phase noise of the phase-locked loop, a ratio of the in-band phase noise and the out-of-band phase noise is generally balanced by adjusting a bandwidth of the phase-locked loop, and a modulation result is generally that contribution ratios of the in-band phase noise and the out-of-band phase noise to the total noise are roughly the same. A theoretical limit (lower limit) of the in-band phase noise is a reference clock noise+log ($N_{div}$) dBc/hertz (Hz); wherein $N_{div}$ represents a ratio of an output frequency of the Phase-Locked Loop (PLL) to a reference clock frequency; dBc is a difference in decibels (dB) between a power at this frequency and a power at a reference. In order to reduce the phase noise of the phase-locked loop, it is necessary to design a smaller bandwidth to reduce the in-band phase noise contributed by the reference clock, which leads to a need to design a VCO with a lower noise to avoid an excessive out-of-band phase noise. In a design of the VCO, phase noise and power consumption are interchangeable, and more power consumption is required to achieve a lower phase noise.

To sum up, due to a limitation of the in-band phase noise of the reference clock, it is difficult to further modulate and optimize the phase noise and the power consumption of the phase-locked loop.

SUMMARY

The following is a summary of subject matters described in the present disclosure in detail. This summary is not intended to limit the scope of protection of claims.

An embodiment of the present disclosure provides a phase-locked loop including: a reference clock unit, a feedback unit, a correction unit, a phase discrimination unit, and a weighting unit; wherein the reference clock unit is configured to: output two or more frequency-adjustable reference clock signals to the phase discrimination unit, and the two or more reference clock signals are synchronized; the feedback unit is configured to: perform frequency division processing on an output voltage signal output by the phase-locked loop in a first period, to obtain a feedback signal; the phase discrimination unit is configured to: determine, for each reference clock signal, a corresponding error signal for correction of the output voltage signal according to a phase difference between the reference clock signal and the feedback signal; the weighting unit is configured to: perform weighting calculation on the determined error signal, to obtain a weighted error signal; the correction unit is configured to: correct an output voltage signal in a second period according to the weighted error signal, to obtain an output voltage signal output by the phase-locked loop in the second period; wherein the first period and the second period are two adjacent periods for outputting output voltage signals.

In an exemplary example, the phase-locked loop further includes a filter configured to: filter the weighted error signal obtained by the weighting unit.

In an exemplary example, the reference clock unit includes two or more first crystal oscillators; wherein a first crystal oscillator is configured to output one of the reference clock signals.

In an exemplary example, the reference clock unit includes one second crystal oscillator and one or more third crystal oscillators; wherein the second crystal oscillator is configured to: output one of the reference clock signals; a third crystal oscillator is configured to: output one of the reference clock signals; wherein a frequency of the reference clock signal output by the second crystal oscillator is greater than a frequency of the reference clock signal output by the third crystal oscillator.

In an exemplary example, a quantity of the third crystal oscillators is 8 or 16.

In an exemplary example, a frequency of the third crystal oscillator is 0.1n kilohertz; wherein the n is a positive integer.

An embodiment of the present disclosure also provides a signal processing device including the phase-locked loop described above.

An embodiment of the present disclosure also provides a signal processing method including: performing frequency division processing on an output voltage signal output by a phase-locked loop in a first period, to obtain a feedback signal; determining, for each reference clock signal of two or more frequency-adjustable reference clock signals, a corresponding error signal according to a phase difference between the reference clock signal and the feedback signal; performing weighting calculation on the determined error signal, to obtain a weighted error signal; and correcting an output voltage signal of the phase-locked loop in a second period according to the obtained weighted error signal, to obtain an output voltage signal output by the phase-locked loop in the second period; wherein the first period and the second period are two adjacent periods for outputting output voltage signals; and the two or more reference clock signals are synchronized.

In an exemplary example, before correcting the output voltage signal of the phase-locked loop in the second period according to the obtained weighted error signal, the method further includes: filtering the obtained weighted error signal.

In an exemplary example, before determining the corresponding error signal according to the phase difference between the reference clock signal and the feedback signal, the method further includes: generating the two or more frequency-adjustable reference clock signals through two or more first crystal oscillators.

After drawings and detailed description are read and understood, other aspects may be understood.

BRIEF DESCRIPTION OF DRAWINGS

The accompanying drawings are used for providing understanding of technical solutions of the embodiments of the present disclosure, and form a part of the specification, and are used for explaining the technical solutions of the embodiments of the present disclosure together with the embodiments of the present disclosure, but do not form limitations on the technical solutions of the embodiments of the present disclosure.

DETAILED DESCRIPTION

In order to make objects, the technical solutions, and advantages of the embodiments of the present disclosure more clearly understood, the embodiments of the present disclosure will be described in detail hereinafter with reference to the accompanying drawings. It should be noted that, the embodiments in the present disclosure and features in the embodiments may be arbitrarily combined with each other if there is no conflict.

Ordinal numbers such as “first”, “second”, and “third” in the specification of the present disclosure are provided in order to avoid confusion of constituent elements, and are not intended to be limited in quantity.

Figure 1:
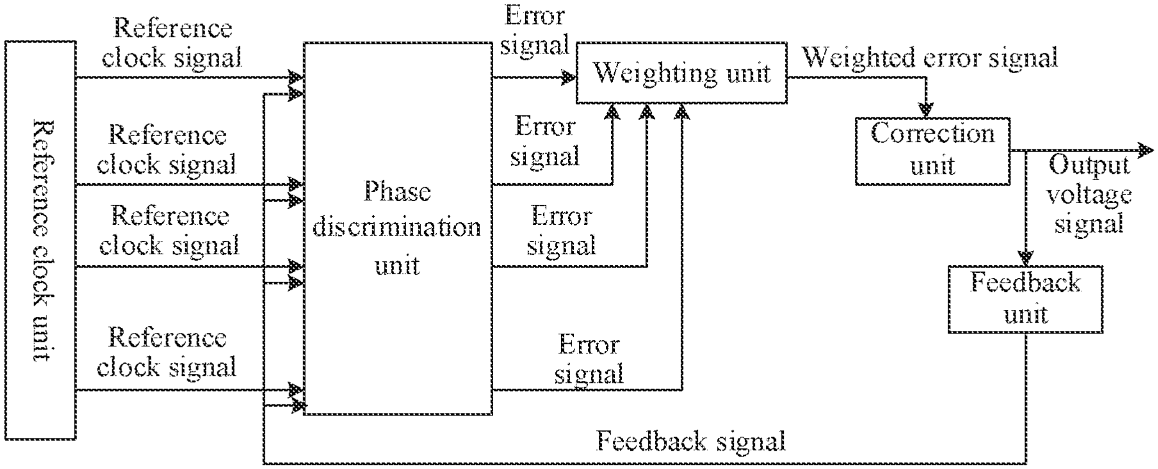
FIG. 1 is a structural block diagram of a phase-locked loop according to an embodiment of the present disclosure.

FIG. 1 is a structural block diagram of a phase-locked loop according to an embodiment of the present disclosure. As shown in FIG. 1, the phase-locked loop may include: a reference clock unit, a feedback unit, a correction unit, a phase discrimination unit, and a weighting unit; wherein the reference clock unit is configured to: output two or more frequency-adjustable reference clock signals to the phase discrimination unit, and the two or more reference clock signals are synchronized; the feedback unit is configured to: perform frequency division processing on an output voltage signal output by the phase-locked loop in a first period, to obtain a feedback signal, the phase discrimination unit is configured to: determine, for each reference clock signal, a corresponding error signal for correction of the output voltage signal according to a phase difference between the reference clock signal and the feedback signal; the weighting unit is configured to: perform weighting calculation on the determined error signal, to obtain a weighted error signal; the correction unit is configured to: correct an output voltage signal in a second period according to the weighted error signal, to obtain an output voltage signal output by the phase-locked loop in the second period; wherein the first period and the second period are two adjacent periods for outputting output voltage signals.

In the embodiment of the present disclosure, multiple error signals are determined through two or more reference clock signals, and by weighting the error signal, phase domain averaging of a reference clock noise of the phase-locked loop is achieved, thereby avoiding an influence of an in-band phase noise of a reference clock on power consumption of the phase-locked loop, and reducing the power consumption of the phase-locked loop.

In an exemplary example, the feedback signal of the embodiment of the present disclosure may include a frequency and/or a phase of the output voltage signal.

In an exemplary example, an output voltage signal in an initial stage may be set to 0. In another exemplary example, the phase-locked loop may further include another auxiliary circuit, and the phase-locked loop in the initial stage may also output another voltage signal provided by the auxiliary circuit.

In an exemplary example, the phase-locked loop of the embodiment of the present disclosure may further include a filter, and the filter is connected between the weighting unit and the correction unit, and is configured to: filter the weighted error signal obtained by the weighting unit.

In an exemplary example, the error signal of the embodiment of the present disclosure may be a digital signal or a voltage signal.

Figure 2A:
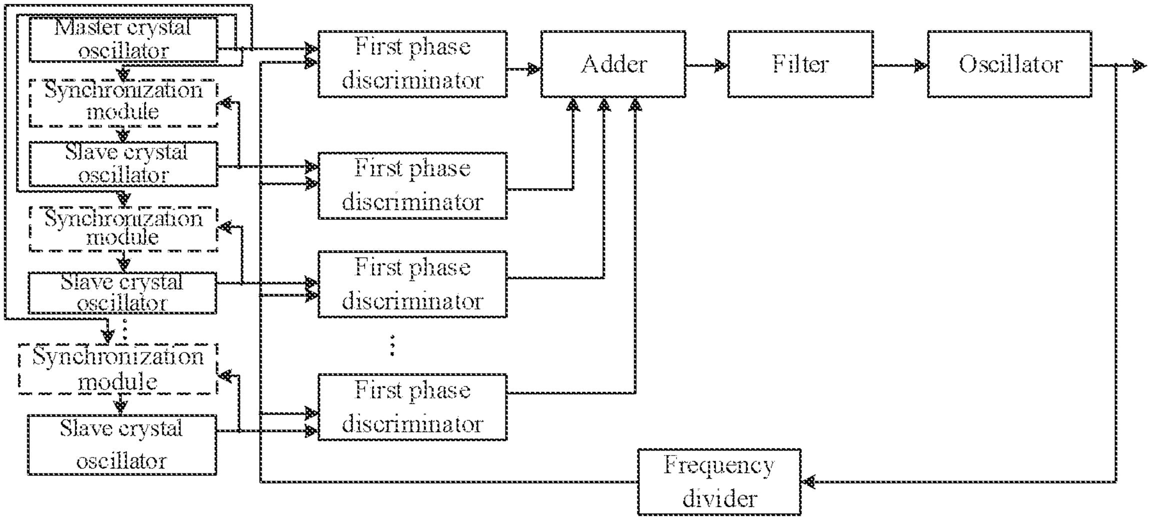
FIG. 2A is an example diagram of a phase-locked loop according to an embodiment of the present disclosure.

In an exemplary example, as shown in FIG. 2A, the phase discrimination unit according to the embodiment of the present disclosure may include a plurality of first phase discriminators or frequency discrimination phase discriminators.

In an exemplary example, as shown in FIG. 2A, the weighting unit of the embodiment of the present disclosure may be an adder.

In an exemplary example, as shown in FIG. 2A, the phase discrimination unit of the embodiment of the present disclosure may include a same quantity of first phase discriminators (frequency discrimination phase discriminators) as a quantity of reference clock signals, and each first phase discriminator (or frequency discrimination phase discriminator) is configured to determine an error signal corresponding to one of the two or more reference clock signals according to a phase difference between the one of the two or more reference clock signals and the feedback signal. In other words, when the phase-locked loop contains N crystal oscillators, the phase discrimination unit contains N first phase discriminators (or frequency discrimination phase discriminators), wherein N is a natural number greater than or equal to 2, and each crystal oscillator is connected with one first phase discriminator (or frequency discrimination phase discriminator) according to a one-to-one correspondence. A first phase discriminator (or frequency discrimination phase discriminator) determines an error signal corresponding to a reference clock signal from a crystal oscillator connected with it according to a phase difference between the reference clock signal and the feedback signal.

Figure 2B:
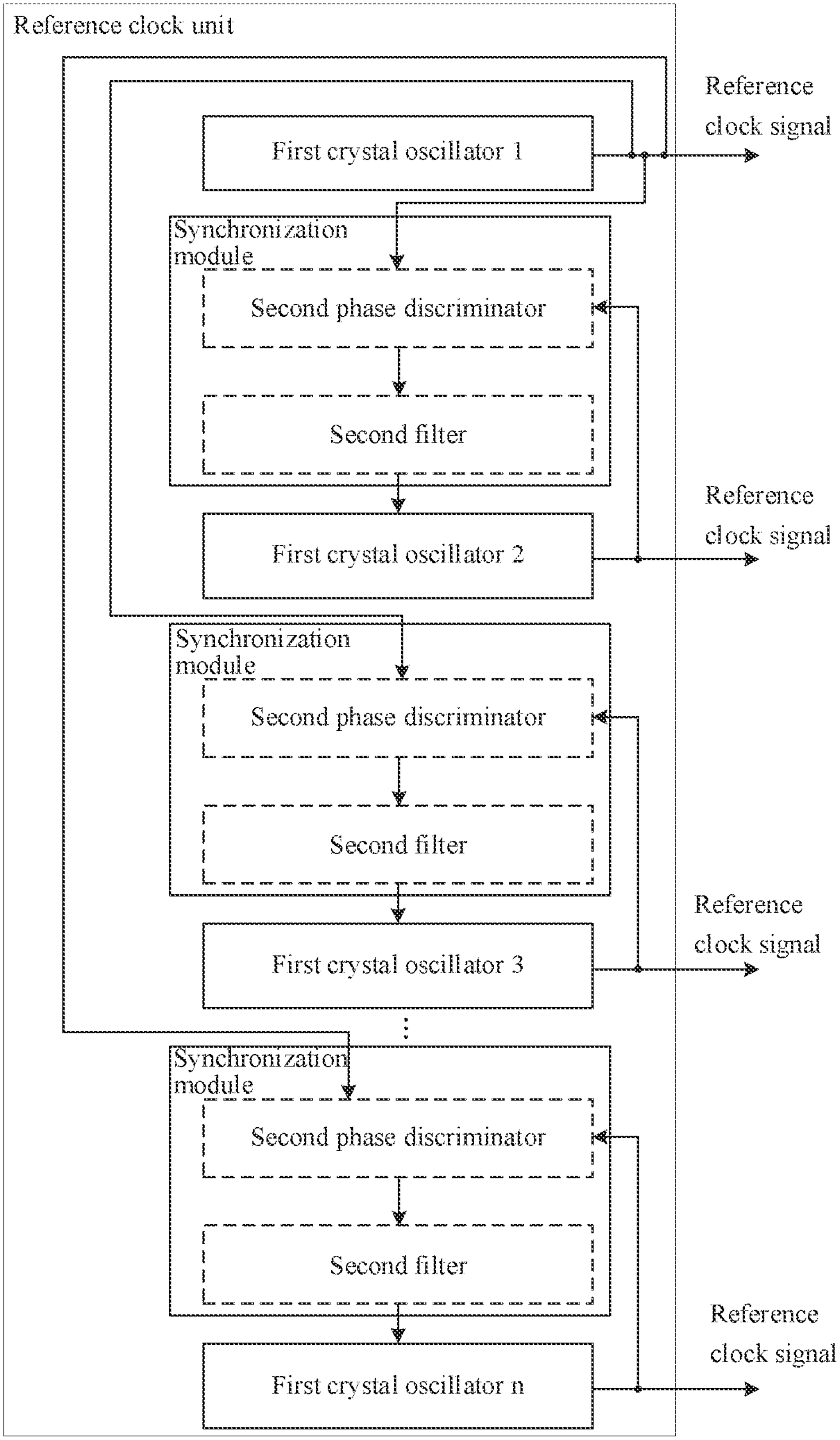
FIG. 2B is an example diagram of a reference clock unit according to an embodiment of the present disclosure.
Figure 2C:
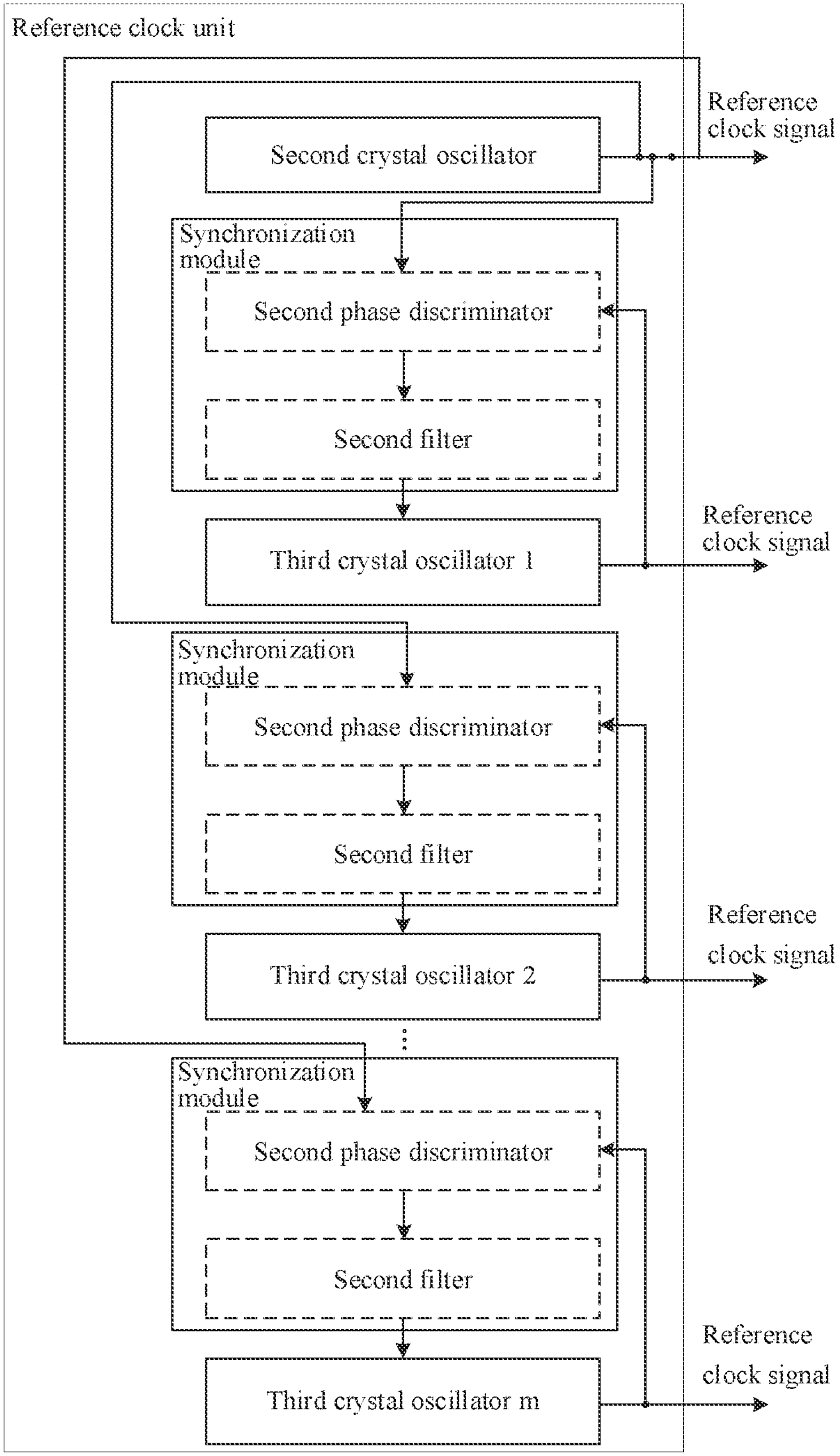
FIG. 2C is an example diagram of another reference clock unit according to an embodiment of the present disclosure.

In an exemplary example, as shown in connection with FIGS. 2A, 2B, and 2C, the reference clock unit includes N crystal oscillators and (N−1) synchronization modules, wherein N is a natural number greater than or equal to 2, the N crystal oscillators include one master crystal oscillator and (N−1) slave crystal oscillators, and each synchronization module includes a second phase discriminator and a second filter; one input terminal of an i-th second phase discriminator is connected with an output terminal of the master crystal oscillator, the other input terminal of the i-th second phase discriminator is connected with an output terminal of an i-th slave crystal oscillator, an output terminal of the i-th second phase discriminator is connected with an input terminal of an i-th second filter, and an output terminal of the i-th second filter is connected with an input terminal of the i-th slave crystal oscillator, wherein i is a natural number between 1 and N−1.

In an exemplary example, as shown in combination with FIGS. 1 and 2A, the phase discrimination unit includes N first phase discriminators; one input terminal of a j-th first phase discriminator is connected with an output terminal of a j-th crystal oscillator, the other input terminal of the j-th first phase discriminator is connected with an output terminal of the feedback unit, and an output terminal of the j-th first phase discriminator is connected with an input terminal of the weighting unit, wherein j is a natural number between 1 and N.

In an exemplary example, as shown in FIG. 2B, the reference clock unit of the embodiment of the present disclosure may include two or more first crystal oscillators; wherein a first crystal oscillator is configured to: output a reference clock signal.

In an exemplary example, the reference clock unit of the embodiment of the present disclosure may include a synchronization circuit configured to synchronize reference clock signals.

In an exemplary example, as shown in FIG. 2B, in the embodiment of the present disclosure, a plurality of first crystal oscillators are numbered as a first crystal oscillator 1, a first crystal oscillator 2, a first crystal oscillator 3, . . . , and a first crystal oscillator n, respectively; after a reference clock signal of the first crystal oscillator 1 is determined as a standard reference clock, a group of a second phase discriminator and a second filter configured to synchronize reference clock signals are connected with an output terminal of the first crystal oscillator 1, an output of the second filter is connected with an input of the first crystal oscillator 2, an output of the first crystal oscillator 2 is connected with an input terminal of the second phase discriminator, and reference clock signals output by the first crystal oscillator 1 and the first crystal oscillator 2 are synchronized through the connected second phase discriminator and the connected second filter; similarly, a group of a second phase discriminator and a second filter are connected between the first crystal oscillator 1 and the first crystal oscillator 3 according to the above principle, so that synchronization of reference clock signals output by the first crystal oscillator 1 and the first crystal oscillator 3 may be achieved: . . . ; a group of a second phase discriminator and a second filter are connected between the first crystal oscillator 1 and the first crystal oscillator n according to the above principle, so that synchronization of reference clock signals output by the first crystal oscillator 1 and the first crystal oscillator n may be achieved. For convenience of presentation, the second phase discriminator and the second filter configured to synchronize reference clock signals are subsequently defined as synchronization modules, a plurality of synchronization modules form a synchronization circuit, and in some exemplary examples, a synchronization module may be understood as a narrowband phase-locked loop.

In another exemplary example, as shown in FIG. 2C, the reference clock unit may include one second crystal oscillator and one or more third crystal oscillators; wherein the second crystal oscillator is configured to: output one reference clock signal; a third crystal oscillator is configured to: output one reference clock signal; wherein a frequency of the reference clock signal output by the second crystal oscillator is greater than a frequency of the reference clock signal output by the third crystal oscillator.

In an exemplary example, a quantity of third crystal oscillators according to the embodiment of the present disclosure may be 8.

In another exemplary example, a quantity of third crystal oscillators according to the embodiment of the present disclosure may be 16.

In an exemplary example, as shown in FIG. 2C, in the embodiment of the present disclosure, a plurality of third crystal oscillators are numbered as a third crystal oscillator 1, a third crystal oscillator 2, . . . , and a third crystal oscillator m, respectively; after a reference clock signal of the second crystal oscillator is determined as a standard reference clock, a group of synchronization modules are connected between the second crystal oscillator and the third crystal oscillator 1 to synchronize reference clock signals output by the second crystal oscillator and the third crystal oscillator 1; similarly, a group of synchronization modules are connected between the second crystal oscillator and the third crystal oscillator 2, . . . , and a group of synchronization modules are connected between the second crystal oscillator and the third crystal oscillator m, so that synchronization of reference clock signals output by the reference clock unit may be achieved.

In an exemplary example, a frequency of the third crystal oscillator of the embodiment of the present disclosure may be 0.1n kilohertz; wherein n is a positive integer.

In an exemplary example, the correction unit in the phase-locked loop of the embodiment of the present disclosure may be an oscillator.

In an exemplary example, the feedback unit in the phase-locked loop of the embodiment of the present disclosure may be a frequency divider.

In an exemplary example, the above-described oscillator in the embodiment of the present disclosure may be a voltage controlled oscillator.

In an exemplary example, the correction unit and the feedback unit in the embodiment of the present disclosure may be replaced by other components according to a result of the phase-locked loop.

In an exemplary example, the first crystal oscillator in the embodiment of the present disclosure may be a Voltage Controlled crystal Oscillator (VCXO) or a numerically controlled crystal oscillator; in an exemplary example, the second crystal oscillator in the embodiment of the present disclosure may be a voltage controlled crystal oscillator or a numerically controlled crystal oscillator; in an exemplary example, the third crystal oscillator in the embodiment of the present disclosure may be a voltage controlled crystal oscillator or a numerically controlled crystal oscillator.

Exemplary illustration is made below by taking an example of the first crystal oscillator, the second crystal oscillator, and the third crystal oscillator all being voltage controlled crystal oscillators, the first crystal oscillator is represented as a first VCXO when it is a voltage controlled crystal oscillator, the second crystal oscillator is represented as a second VCXO when it is a voltage controlled crystal oscillator, and the third crystal oscillator is represented as a third VCXO when it is a voltage controlled crystal oscillator. In this example, a case in which the reference clock unit includes one second VCXO and one or more third VCXOs, and is configured to output N reference clock signals, the phase discrimination unit contains N first phase discriminators, the weighting unit is an adder, and the filter, the correction unit, and the feedback unit in the phase-locked loop are connected in sequence is taken as an example for explanation. FIG. 2A is an example diagram of a phase-locked loop according to an embodiment of the present disclosure, as shown in FIG. 2A, when a VCXO of the embodiment of the present disclosure is a second VCXO, it may be determined as a master crystal oscillator (MasterVCXO), and when the VCXO is a third VCXO, N−1 third VCXOs may be regarded as N−1 slave crystal oscillators (SlaveVCXOs), and each slave crystal oscillator is controlled by a synchronization module to synchronize it with the master crystal oscillator. The phase-locked loop of the embodiment of the present disclosure includes one main phase-locked loop and N−1 (N−1 is greater than or equal to 1, and may be 8 or 16) synchronous phase-locked loops, wherein the main phase-locked loop includes a first phase discriminator, an adder, a filter, an oscillator, and a frequency divider, and a synchronous phase-locked loop includes a second phase discriminator and a second filter; wherein a bandwidth of a synchronous phase-locked loop is much smaller than that of the main phase-locked loop, because a frequency range of the bandwidth of the main phase-locked loop is higher than that of the bandwidth of the synchronous phase-locked loop, and a phase noise of each crystal oscillator is irrelevant. In the embodiment of the present disclosure, an output of each crystal oscillator is phase-discriminated with an output of the feedback unit, and there are N first phase discriminators in total. Outputs of the first phase discriminators are averaged, and phase domain averaging of reference clock noises is achieved, that is, an equivalent reference clock with an equivalent noise is 1/(N) of a single crystal oscillator is achieved. Noise averaging in the phase domain is achieved, a noise of the equivalent reference clock of the phase-locked loop is reduced, and limitations of a noise and power consumption of a traditional phase-locked loop are avoided. It is beneficial to reduce a noise and power consumption of the whole phase-locked loop.

An embodiment of the present disclosure also provides a signal processing device including the phase-locked loop according to any embodiment of the present disclosure.

In an exemplary example, the signal processing device according to the embodiment of the present disclosure may further include a receiver, a clock circuit, a frequency sweep circuit, or a local oscillator circuit.

Figure 3:
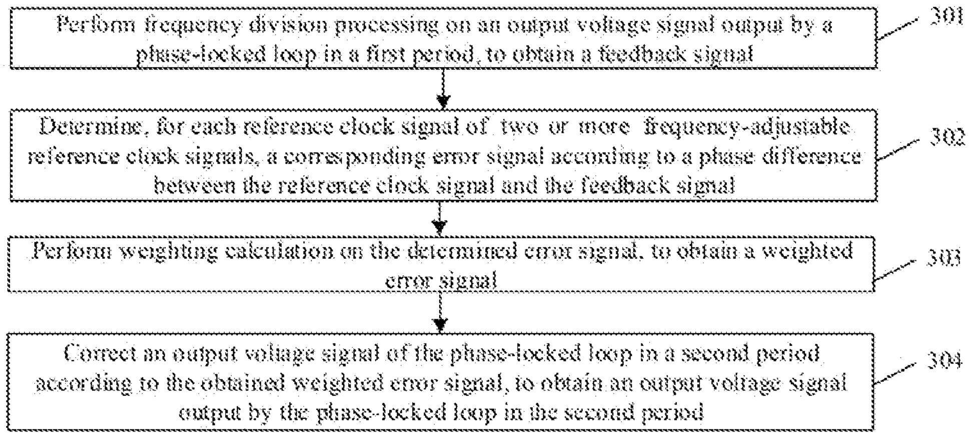
FIG. 3 is a flowchart of a signal processing method according to an embodiment of the present disclosure.

FIG. 3 is a flowchart of a signal processing method according to an embodiment of the present disclosure. As shown in FIG. 3, the method may include following acts.

Act 301: performing frequency division processing on an output voltage signal output by a phase-locked loop in a first period, to obtain a feedback signal.

Act 302: determining, for each reference clock signal of two or more frequency-adjustable reference clock signals, a corresponding error signal according to a phase difference between the reference clock signal and the feedback signal.

Act 303: performing weighting calculation on the determined error signal, to obtain a weighted error signal.

Act 304: correcting an output voltage signal of the phase-locked loop in a second period according to the obtained weighted error signal, to obtain an output voltage signal output by the phase-locked loop in the second period.

Among them, the first period and the second period are periods of two adjacent output voltage signals; the two or more reference clock signals are synchronized.

In the embodiment of the present disclosure, multiple error signals are determined through the two or more reference clock signals, and by weighting the error signal, phase domain averaging of a reference clock noise of the phase-locked loop is achieved, thereby avoiding an influence of an in-band phase noise of a reference clock on power consumption of the phase-locked loop, and reducing the power consumption of the phase-locked loop.

In an exemplary example, before correcting the output voltage signal generated by the oscillator according to the obtained weighted error signal, the method of the embodiment of the present disclosure may further include: filtering the obtained weighted error signal.

In an exemplary example, before determining the corresponding error signal according to the phase difference between each reference clock signal and the feedback signal, respectively, the method of the embodiment of the present disclosure may further include: generating two or more reference clock signals through two or more first crystal oscillators.

In an exemplary example, before determining the corresponding error signal according to the phase difference between each reference clock signal and the feedback signal, respectively, the method of the embodiment of the present disclosure may further include: generating two or more reference clock signals through one second crystal oscillator and one or more third crystal oscillators.

Those of ordinary skill in the art may understand that all or some of the acts in the methods, systems, functional modules/units in the apparatus disclosed above may be implemented as software, firmware, hardware, and suitable combinations thereof. In a hardware implementation mode, division between functional modules/units mentioned in the above description does not necessarily correspond to division of physical components. For example, one physical component may have multiple functions, or one function or act may be performed by several physical components in cooperation. Some or all components may be implemented as software executed by a processor, such as a digital signal processor or microprocessor, or as hardware, or as an integrated circuit, such as an application specific integrated circuit. Such software may be distributed on a computer-readable medium, which may include a computer storage medium (or non-transitory medium) and a communication medium (or transitory medium). As is well known to those of ordinary skill in the art, the term computer storage medium includes volatile and non-volatile, removable and non-removable media implemented in any method or technique for storing information (such as computer-readable instructions, data structures, program modules, or other data). The computer storage medium includes, but is not limited to, a Random Access Memory (RAM), a Read Only Memory (ROM), an Electrically Erasable Programmable Read Only Memory (EEPROM), a flash memory or another memory technology, a Compact Disc Read Only Memory (CD-ROM), a Digital Versatile Disk (DVD) or other optical disk storage, a magnetic cartridge, a magnetic tape, magnetic disk storage or another magnetic storage apparatus, or any other medium that may be used to store desired information and may be accessed by a computer. In addition, it is well known to those of ordinary skill in the art that the communication medium typically contains computer-readable instructions, a data structure, a program module, or other data in a modulated data signal such as a carrier wave or another transmission mechanism, and may include any information delivery medium.

What is claimed is:

1. A phase-locked loop comprising: a reference clock circuit, a feedback circuit, a correction circuit, a phase discrimination circuit, and a weighting circuit; wherein the reference clock circuit is configured to: output two or more frequency-adjustable reference clock signals to the phase discrimination circuit, and the two or more reference clock signals are synchronized;

the feedback circuit is configured to: perform frequency division processing on an output voltage signal output by the phase-locked loop in a first period, to obtain a feedback signal;

the phase discrimination circuit is configured to: determine, for each reference clock signal, a corresponding error signal for correction of the output voltage signal according to a phase difference between the reference clock signal and the feedback signal;

the weighting circuit is configured to: perform weighting calculation on the determined error signal, to obtain a weighted error signal;

the correction circuit is configured to: correct an output voltage signal in a second period according to the weighted error signal, to obtain an output voltage signal output by the phase-locked loop in the second period;

wherein the first period and the second period are two adjacent periods for outputting output voltage signals;

wherein the reference clock circuit comprises one second crystal oscillator and one or more third crystal oscillators; wherein the second crystal oscillator is configured to: output one of the reference clock signals;

a third crystal oscillator is configured to: output one of the reference clock signals; and wherein a frequency of the reference clock signal output by the second crystal oscillator is greater than a frequency of the reference clock signal output by the third crystal oscillator.

2. The phase-locked loop according to claim 1, wherein the phase-locked loop further comprises a filter configured to:

filter the weighted error signal obtained by the weighting circuit.

3. The phase-locked loop according to claim 2, wherein the reference clock circuit comprises N crystal oscillators and (N−1) synchronization modules, N is a natural number greater than or equal to 2, the N crystal oscillators comprise one master crystal oscillator and (N−1) slave crystal oscillators, and each of the synchronization modules comprises one second phase discriminator and one second filter;

one input terminal of an i-th second phase discriminator is connected with an output terminal of the master crystal oscillator, the other input terminal of the i-th second phase discriminator is connected with an output terminal of an i-th slave crystal oscillator, an output terminal of the i-th second phase discriminator is connected with an input terminal of an i-th second filter, and an output terminal of the i-th second filter is connected with an input terminal of the i-th slave crystal oscillator, wherein i is a natural number between 1 and N−1.

4. A signal processing device comprising a phase-locked loop according to claim 2.

5. The phase-locked loop according to claim 1, wherein a quantity of the third crystal oscillators is 8 or 16.

6. A signal processing device comprising a phase-locked loop according to claim 5.

7. The phase-locked loop according to claim 1, wherein a frequency of the third crystal oscillator is 0.1n kilohertz;

wherein the n is a positive integer.

8. The phase-locked loop according to claim 1, wherein the reference clock circuit comprises N crystal oscillators and (N−1) synchronization modules, N is a natural number greater than or equal to 2, the N crystal oscillators comprise one master crystal oscillator and (N−1) slave crystal oscillators, and each of the synchronization modules comprises one second phase discriminator and one second filter;

one input terminal of an i-th second phase discriminator is connected with an output terminal of the master crystal oscillator, the other input terminal of the i-th second phase discriminator is connected with an output terminal of an i-th slave crystal oscillator, an output terminal of the i-th second phase discriminator is connected with an input terminal of an i-th second filter, and an output terminal of the i-th second filter is connected with an input terminal of the i-th slave crystal oscillator, wherein i is a natural number between 1 and N−1.

9. The phase-locked loop according to claim 8, wherein the phase discrimination circuit comprises N first phase discriminators;

one input terminal of a j-th first phase discriminator is connected with an output terminal of a j-th crystal oscillator, the other input terminal of the j-th first phase discriminator is connected with an output terminal of the feedback circuit, and an output terminal of the j-th first phase discriminator is connected with an input terminal of the weighting circuit, wherein j is a natural number between 1 and N.

10. The phase-locked loop according to claim 1, wherein the correction circuit is a voltage controlled oscillator.

11. The phase-locked loop according to claim 1, wherein the feedback circuit is a frequency divider.

12. A signal processing device comprising a phase-locked loop according to claim 1.

13. A signal processing method comprising:

performing frequency division processing on an output voltage signal output by a phase-locked loop in a first period, to obtain a feedback signal;

determining, for each reference clock signal of two or more frequency-adjustable reference clock signals, a corresponding error signal according to a phase difference between the reference clock signal and the feedback signal;

performing weighting calculation on the determined error signal, to obtain a weighted error signal; and correcting an output voltage signal of the phase-locked loop in a second period according to the obtained weighted error signal, to obtain an output voltage signal output by the phase-locked loop in the second period;

wherein the first period and the second period are two adjacent periods for outputting output voltage signals; and the two or more reference clock signals are synchronized; and wherein before determining the corresponding error signal according to the phase difference between the reference clock signal and the feedback signal, the method further comprises:

generating the two or more frequency-adjustable reference clock signals through one second crystal oscillator and one or more third crystal oscillators, wherein a frequency of a reference clock signal output by the second crystal oscillator is greater than a frequency of a reference clock signal output by a third crystal oscillator.

14. The method according to claim 13, wherein before correcting the output voltage signal of the phase-locked loop in the second period according to the obtained weighted error signal, the method further comprises:

filtering the obtained weighted error signal.

* * * * *